United States Patent [19]

Cosentino

[11] Patent Number: 5,037,768
[45] Date of Patent: Aug. 6, 1991

[54] METHOD OF FABRICATING A DOUBLE POLYSILICON BIPOLAR TRANSISTOR WHICH IS COMPATIBLE WITH A METHOD OF FABRICATING CMOS TRANSISTORS

[75] Inventor: Stephen J. Cosentino, Gilbert, Ariz.

[73] Assignee: Motorola, Inc., Schaumburg, Ill.

[21] Appl. No.: 478,896

[22] Filed: Feb. 12, 1990

[51] Int. Cl.$^5$ .................................. H01L 21/265
[52] U.S. Cl. ............................... 437/31; 437/33
[58] Field of Search .......................... 437/31, 33

[56] References Cited

U.S. PATENT DOCUMENTS

| 4,495,512 | 1/1985 | Isaac et al. | 437/31 |
| 4,731,341 | 3/1988 | Kawakatsu | 437/31 |
| 4,734,382 | 3/1988 | Krishna | 437/33 |
| 4,783,422 | 11/1988 | Kawakatsu | 437/33 |
| 4,812,417 | 3/1989 | Hirao | 437/33 |
| 4,873,200 | 10/1989 | Kawakatsu | 437/33 |
| 4,902,640 | 2/1990 | Sachitano et al. | 437/31 |
| 4,952,521 | 8/1990 | Goto | 437/33 |
| 4,960,726 | 10/1990 | Lechaton et al. | 437/33 |

FOREIGN PATENT DOCUMENTS 0261746 10/1988 Japan .

Primary Examiner—Brian E. Hearn
Assistant Examiner—Gordon V. Hugo
Attorney, Agent, or Firm—Miriam Jackson

[57] ABSTRACT

An improved bipolar transistor of a BiCMOS integrated circuit is fabricated by utilizing a nitride layer combined with two polysilicon layers to form a self-aligned P-type extrinsic base which results in lower base resistance and lower base-collector capacitance, and thus improved performance.

7 Claims, 4 Drawing Sheets

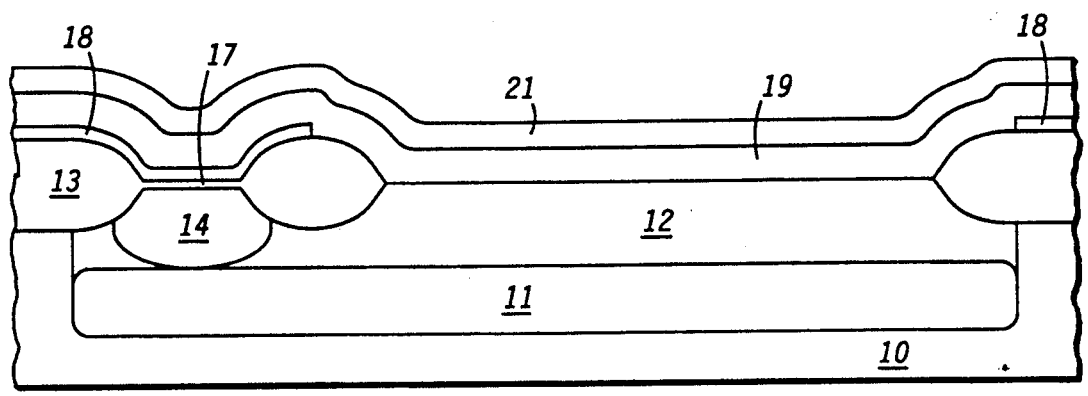
FIG. 1
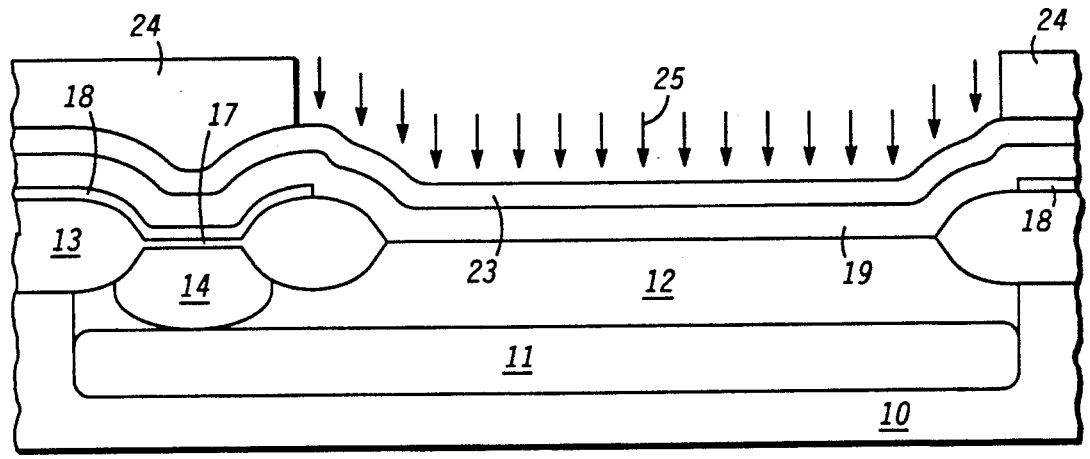
FIG. 2
FIG. 3
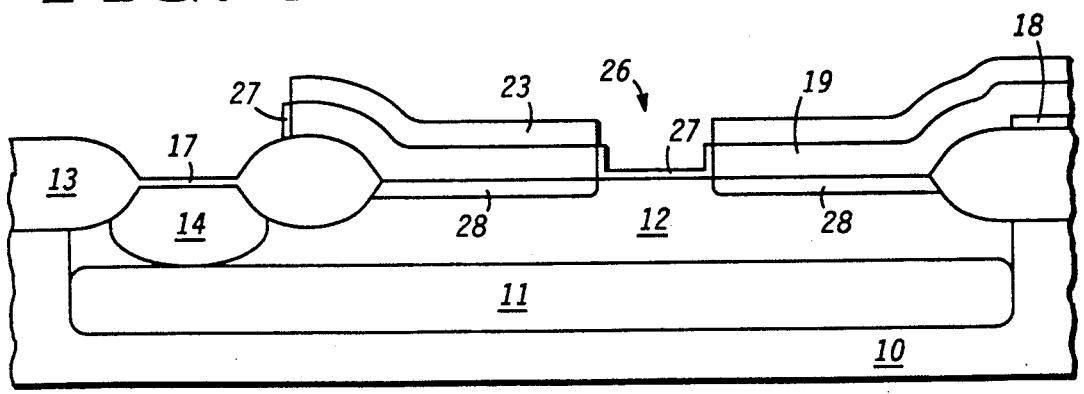

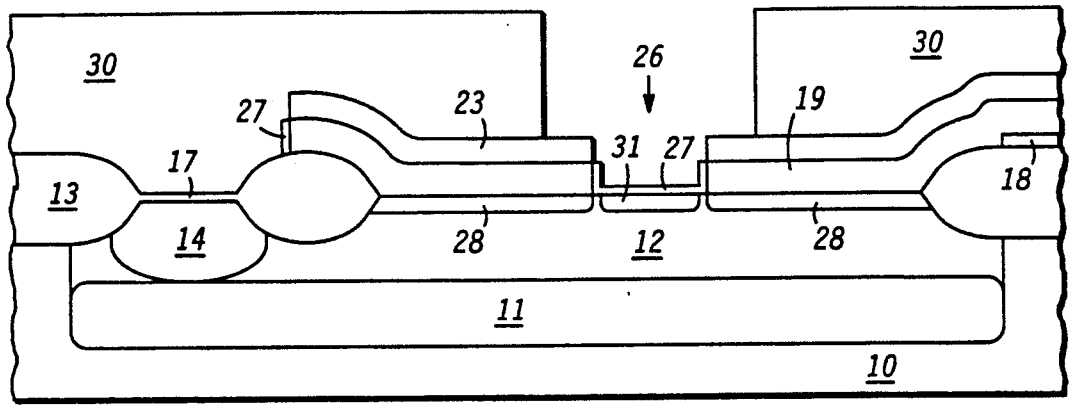
FIG. 4
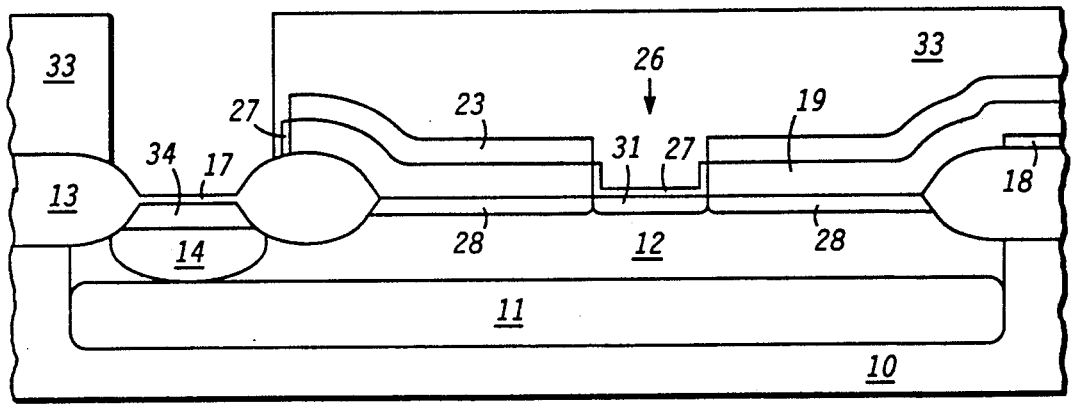
FIG. 5
FIG. 6
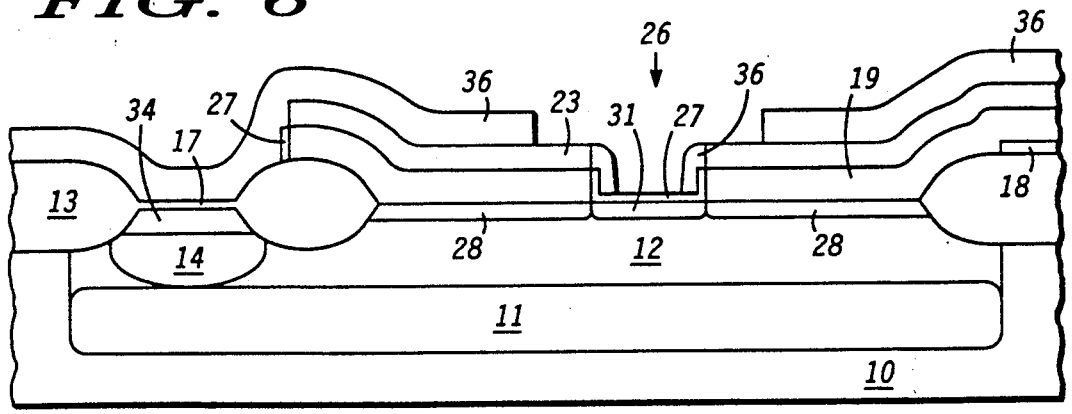

METHOD OF FABRICATING A DOUBLE POLYSILICON BIPOLAR TRANSISTOR WHICH IS COMPATIBLE WITH A METHOD OF FABRICATING CMOS TRANSISTORS

BACKGROUND OF THE INVENTION

This invention relates, in general, to semiconductor devices, and more particularly, to an improved method of fabricating a bipolar transistor which is compatible with a method of fabricating CMOS transistors.

When integrating bipolar transistors with MOS transistors, compromises must be made to either the MOS transistors or the bipolar transistors, or both, in order to integrate the transistors on a single chip. Thus, any improvement which simplifies the BiCMOS fabrication process, or improves the electrical characteristics of the transistors is desirable. Some circuits require the bipolar transistors to have improved performance. In order to fabricate a high performance bipolar transistor, it is essential to minimize base resistance and base-collector capacitance. A reduction in these parameters will improve the switching speed of the bipolar transistor. A bipolar process which is very compatible with the MOS process is desirable to reduce the number of processing steps and the number of photolithography steps. This will allow for an improvement in yield and a decrease in cycle time.

By now it should be appreciated that it would be advantageous to provide an improved method of fabricating a high perfomance bipolar transistor that is also compatible with a method of fabricating CMOS transistors.

Accordingly, it is an object of the present invention to provide an improved method of fabricating a bipolar transistor of a BiCMOS integrated circuit.

Another object of the present invention is to provide an improved method of fabricating a bipolar transistor having a reduced base resistance.

A futher object of the present invention is to provide a method of fabricating a bipolar transistor having a self-aligned extrinsic base.

An additional object of the present invention is to provide a method of fabricating a bipolar transistor having a reduced base-collector capacitance.

Yet another object of the present invention is to provide a method of fabricating a bipolar transistor utilizing two polysilicon layers.

SUMMARY OF THE INVENTION

In accordance with the present invention, the above and other objects and advantages are provided by a method of fabricating a bipolar transistor which is highly compatible with a method of fabricating CMOS transistor. A double polysilicon bipolar transistor utilizes a self-aligned P+ extrinsic base region to lower base resistance and improve the transistor performance. The use of a nitride spacer and two polysilicon layers permits the fabrication of this improved bipolar structure.

BRIEF DESCRIPTION OF THE DRAWINGS

FIGS. 1 through 8 illustrate enlarged, cross-sectional views of a bipolar transistor of the present invention during various stages of fabrication utilizing a first embodiment of the present invention.

DETAILED DESCRIPTION OF THE DRAWINGS

Figure 7:
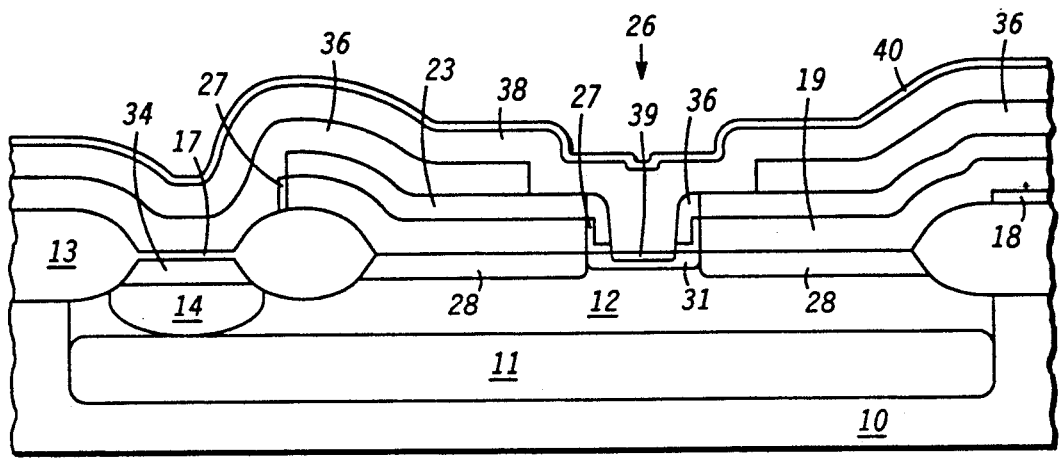

FIG. 1 illustrates an enlarged, cross-sectional view of a bipolar transistor in a beginning stage of fabrication. For illustrative convenience, only an NPN bipolar transistor will be fabricated. However, it should be understood that in a BiCMOS circuit, combinations of NPN and PNP transistors are typically formed in combination with PMOS and NMOS transistors. The CMOS portion of the circuit will not be illustrated here. The processing steps used in the present invention are standard processes well known in the art, unless otherwise specified. What is shown in FIG. 1 is a P-type substrate 10, an N-type buried layer 11, an N-type well 12, upon which field oxide regions 13 are grown. An N-type deep collector 14 is formed between two field oxide regions 13. N-type deep collector 14 reduces the series resistance of the collector contact to the active bipolar transistor to be fabricated by lowering the resistance between the surface of the integrated circuit and N-type buried layer 11, which serves as the collector. Subsequently, a thin layer of silicon dioxide 17 is grown on the bare silicon surface for use as the gate oxide in the CMOS portion of the circuit. A thin layer of polysilicon 18 is then deposited over silicon dioxide 17 in order to protect the integrity of silicon dioxide 17 in the CMOS portion. The thickness of polysilicon 18 is preferably approximately 400 to 600 angstroms. In the bipolar area, however, polysilicon 18 and silicon dioxide 17 are etched away in order to expose single crystal silicon. Thereafter, another polysilicon layer 19 is deposited over all of the circuit. The thickness of polysilicon layer 19 is preferably in the range of approximately 2000 to 4000 angstroms, but other thicknesses may also be suitable. On the surface of polysilicon layer 19, a masking layer 21 is formed. Masking layer 21 is preferably a dielectric layer of a silicon dioxide layer or a nitride layer, or a combination thereof. The thickness of masking layer 21 must be thick enough to block subsequent N-type doping (not shown) of polysilicon layers 19 and 18 in the CMOS portion.

FIG. 2 illustrates the structure of FIG. 1 further along in the fabrication process. First, masking layer 21 is removed and a dielectric layer, preferably a silicon dioxide layer 23 is formed over polysilicon layer 19. A photoresist mask 24 is then formed and patterned to provide an opening over the bipolar portion of the circuit. A P-type dopant is implanted, represented by arrows 25, through silicon dioxide layer 23 into polysilicon layer 19. The doping concentration of the P-type dopant is approximately $1 \times 10^{15}$ to $1 \times 10^{17}$ atoms/cm$^3$, but preferably as heavy a concentration as possible is used.

Shown in FIG. 3 is the structure of FIG. 2 further along in the fabrication process. First, photoresist layer 24 is removed, and another photoresist layer (not shown) is patterned to provide an opening through which silicon dioxide layer 23 and polysilicon layer 19 are etched to provide an emitter window 26 and an opening over deep collector 14. The photoresist layer is then also removed and a thin silicon dioxide layer 27 of approximately 100 angstroms is formed by oxidation on the sides of polysilicon layer 19 and in emitter window 26. During the formation of silicon dioxide layer 27, some of the P-type dopants from polysilicon layer 19 are driven into N-type well 12 to form a P-type extrinsic base region 28. A further exposure to a heat cycle may be desirable to further drive P-type extrinsic base region 28 into N-type well 12.

FIG. 4 illustrates the structure of FIG. 3 further along in the fabrication process. Photoresist layer 30 is formed and patterned on the circuit to provide an opening around emitter window 26 as shown in FIG. 4. Next, a P-type dopant is implanted through silicon dioxide layer 27 and driven in to form an active base region 31. The doping concentration of the P-type implant is preferably approximately 1 to $2 \times 10^{13}$ atoms/cm$^3$ of boron, however, other suitable doses may be used.

FIG. 5 illustrates the structure of FIG. 4 with photoresist layer 30 removed and another photoresist layer 33 formed on the surface of the circuit. $N^-$-type region 34 is formed in deep collector 14 to further enhance the doping concentration. The implant used to form $N^-$-type region 34 is the same implant used to form the $N^-$-type source/drain regions of the CMOS portion of the transistor. The $P^-$-type source/drain regions are also formed at this time, but this $P^-$-type implant is totally blocked out of the NPN bipolar portion by photoresist (this step is not shown). In addition, the $N^+$-type and $P^+$-type source/drain regions in the CMOS portion may be formed, however, they can also be formed at a later time in the process (see FIG. 8). If the $N^+$-type and $P^+$-type source/drain regions are formed at this time, the $N^+$-type dopants used to form the CMOS source/drain regions would also be used to form an $N^+$-type region (as is shown in FIG. 8 as $N^+$-type region 42) in $N^-$-type region 34.

FIG. 6 illustrates the structure of FIG. 5 with photoresist 33 removed and with a nitride layer 36 formed and patterned on the surface on the circuit. Nitride layer 36 is etched to form an opening around emitter window 26 and to form nitride spacers 36 in emitter window 26. A dry etch that preferentially etches nitride over silicon dioxide is preferably used, so that etching stops on silicon dioxide layer 27 to prevent damage and contamination to the silicon in active base region 31 where an emitter region is to be formed.

FIG. 7 illustrates the structure of FIG. 6 further along in the fabrication process. First, the portion of silicon dioxide layer 27 which is not covered by nitride layer 36 is etched, preferably by a wet etch method. Subsequently, a polysilicon emitter layer 38 is deposited on nitride layer 36, on silicon dioxide 23, and in emitter window 26. The thickness of polysilicon emitter layer 38 is preferably in the range of approximately 1500 to 3000 angstroms. Polysilicon emitter layer 38 is then doped N-type, preferably with arsenic of a concentration in the range of approximately $5 \times 10^{15}$ to $10 \times 10^{15}$ atoms/cm$^3$. Subsequently, the circuit may be annealed to form emitter region 39 in active base region 31 by driving in the N-type dopants from polysilicon emitter layer 38. This is an optional step because further annealing will take place which would also form emitter region 39. Nitride spacers 36 offset emitter region 39 from P-type extrinsic base 28. Emitter region 39 is thus self-aligned to extrinsic base 28, which provides for a lower base resistance and lower base-collector capacitance, and thus a high performance bipolar transistor. A silicide layer 40 is then formed on polysilicon emitter layer 38. Silicide layer 40 may be comprised of titanium, platinum, tungsten, molybdenum, or the like.

Figure 8:
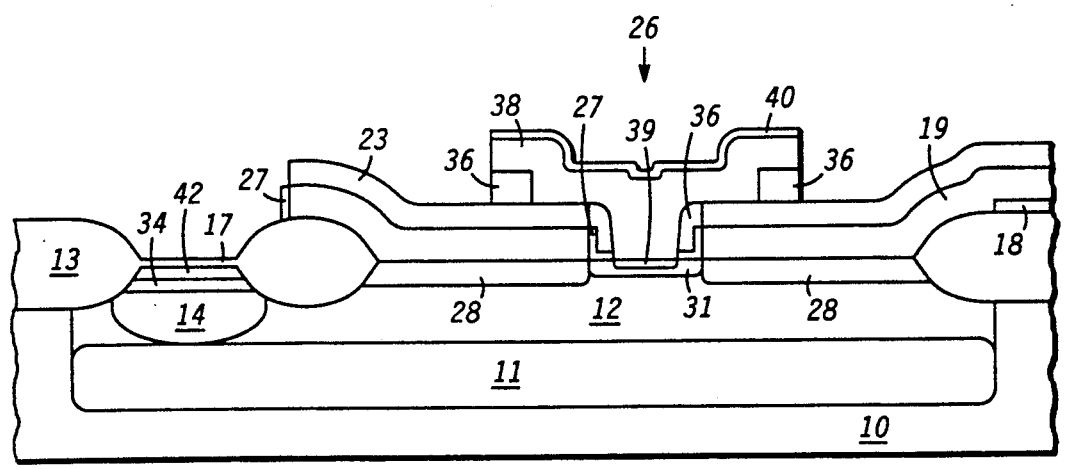

FIG. 8 illustrates the structure of FIG. 7 further along in the process. Portions of silicide layer 40, polysilicon emitter layer 38, and nitride layer 36 are then etched. Portions of silicide layer 40, polysilicon emitter layer 38, and nitride layer 36 which surround emitter window 26 are left remaining. An etch which preferentially etches nitride is preferably used, in order to stop etching on silicon dioxide layer 23. Alternatively, it may be desirable to totally remove nitride layer 36 from the surface of silicon dioxide layer 23, except for nitride spacers 36. This can be done by removing those portions of silicide layer 40 and polysilicon emitter layer 38 which overlap nitride layer 36. When nitride layer 36 is etched, nitride spacers are also formed in the CMOS portion of the circuit, and thus may be used to form the $N^+$-type and $P^+$-type source/drain regions of the CMOS. At the same time, the $N^+$-type dopants are used to form an $N^+$-type region 42 in $N^-$-type region 34 to further enhance the doping of deep collector 14. The $P^+$-type implant is not used in the bipolar portion of the circuit. The $N^+$-type and $P^+$-type source/drains of the CMOS could alternatively be formed previously as described with reference to FIG. 5. Those skilled in the art will be able to recognize that other variations not illustrated here may be made in processing, or in the order of the processing steps, that would essentially result in the same structure as shown in FIG. 8.

Figure 9:
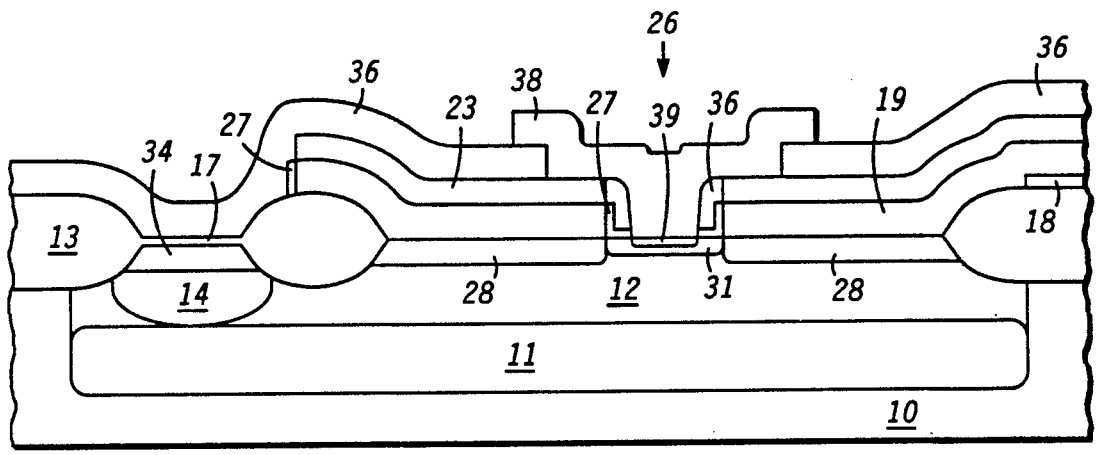
FIGS. 9 through 10 illustrate enlarged, cross-sectional views of a bipolar transistor of the present invention during various stages of fabrication utilizing a second embodiment of the present invention.
Figure 10:
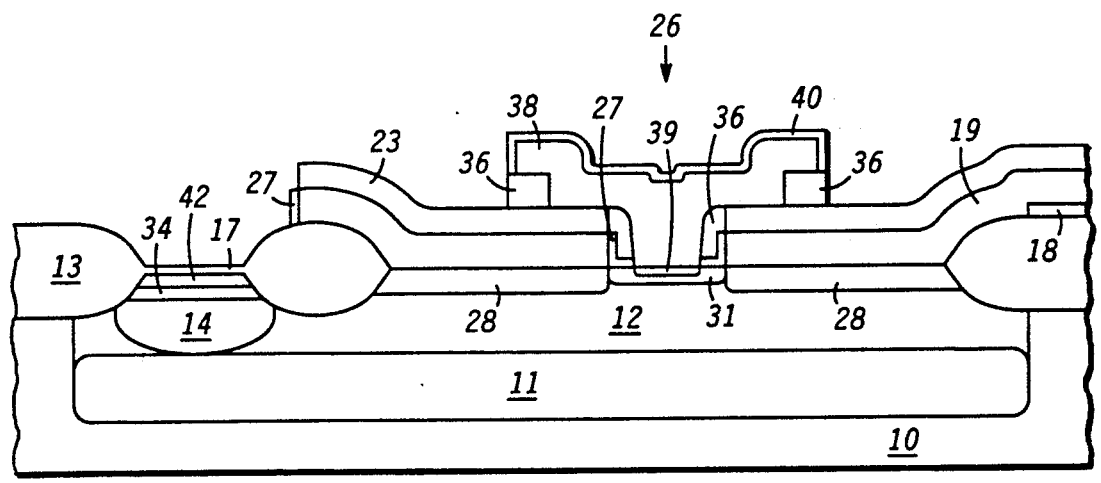

FIGS. 9 through 10 illustrate an alternative method of forming substantially the same structure as is shown in FIG. 8. The method illustrated in FIGS. 1 through 8 is, however, the preferable way of carrying out the present invention. FIG. 9 illustrates the structure of FIG. 6 further along in the fabrication process. The same numerals are used to represent the same layers or regions as shown in FIGS. 1 through 8. Polysilicon emitter layer 38 is formed and doped in the same way as is described in FIG. 7. However, portions of polysilicon emitter layer 38 are first etched using standard photolithography and etch processe before silicide layer 40 is formed. Polysilicon emitter layer 38 is left remaining in emitter window 26 and on silicon dioxide layer 23 and slightly overlapping nitride layer 36.

FIG. 10 illustrates the structure of FIG. 9 further along in the fabrication process. Silicide layer 40 is first formed on polysilicon emitter layer 38. Then, portions of nitride layer 36 are etched by utilizing silicide layer 40 as a mask. The remaining portions of nitride layer 36 are the nitride spacers and nitride covered by polysilicon emitter layer 38 and silicide layer 40. $N^+$-type region 42 may be formed in the same manner as previously described with reference to FIG. 8. As one can see, the structure of FIG. 10 is substantially similar to that of FIG. 8. The difference is that silicide layer 40 is formed on the sides of polysilicon emitter layer 38 when using the alternative process as shown in FIGS. 9 through 10.

The processing steps used to complete the fabrication of the structure shown in FIG. 8 or 10 is standard and well known in the art, and thus are not illustrated here.

By now it should be appreciated that there has been provided a new and improved method of fabricating a high performance bipolar transistor that is compatible with a method of fabricating CMOS transistors.

I claim:

1. A method of fabricating a bipolar transistor, comprising the steps of:
   providing a semiconductor substrate;

forming a polysilicon layer on the substrate;
forming a dielectric layer on the substrate;
doping the polysilicon layer;
etching the dielectric layer and the polysilicon layer to provide an emitter window;
forming a silicon dioxide layer in the emitter window;
forming an extrinsic base underneath the polysilicon layer in the substrate;
forming an active base region in the substrate through the emitter window;
forming a nitride layer on the dielectric layer and in the emitter window on the silicon dioxide layer;
etching a portion of the nitride layer surrounding the emitter window to form nitride spacers in the emitter window, wherein a portion of the nitride layer is also left remaining;
etching the silicon dioxide layer in the emitter window;
forming a polysilicon emitter layer in the emitter window, on the dielectric layer, and on the nitride layer;
doping the polysilicon emitter layer and annealing to form an emitter region in the active base region;
forming a silicide layer on the polysilicon emitter layer; and
etching portions of the silicide layer, the polysilicon emitter layer, and the nitride layer such that at least portions of the silicide layer and the polysilicon emitter layer are left remaining surrounding the emitter window.

2. The method of claim 1 wherein the substrate is comprised of a substrate of a first conductivity type, a buried layer of a second conductivity type, and a region of the second conductivity type.

3. The method of claim 2 further comprising the step of forming a deep collector region in the substrate before forming the polysilicon layer, wherein the deep collector region makes contact with the buried layer.

4. The method of claim 1 wherein the dielectric layer comprises a silicon dioxide layer.

5. The method of claim 1 further comprising the steps of:
forming a thin silicon dioxide layer on the substrate;
forming a thin polysilicon layer on the thin silicon dioxide layer; and
removing the thin silicon dioxide and the thin polysilicon layer before forming the polysilicon layer.

6. The method of claim 1 wherein a portion of the nitride layer, in addition to the nitride spacers, is also left remaining surrounding the emitter window after etching portions of the silicide layer, the polysilicon emitter layer and the nitride layer.

7. A method of fabricating a bipolar transistor, comprising the steps of:
providing a semiconductor substrate;
forming a polysilicon layer on the substrate
forming a dielectric layer on the substrate;
doping the polysilicon layer;
etching the dielectric layer and the polysilicon layer to provide an emitter window;
forming a silicon dioxide layer in the emitter window;
forming an extrinsic base underneath the polysilicon layer in the substrate;
forming an active base region in the substrate through the emitter window;
forming a nitride layer on the dielectric layer and in the emitter window on the silicon dioxide layer;
etching a portion of the nitride layer to form nitride spacers in the emitter window;
etching the silicon dioxide layer in the emitter window;
forming a polysilicon emitter layer in the emitter window, on the dielectric layer and partially overlapping the nitride layer;
doping the polysilicon emitter layer and annealing to form an emitter region in the active base region;
forming a silicide layer on the polysilicon emitter layer; and
etching the nitride layer not covered by the polysilicon emitter layer, using the silicide as a mask.

* * * * *